US010636343B2

(12) United States Patent
Yang

(10) Patent No.: US 10,636,343 B2
(45) Date of Patent: Apr. 28, 2020

(54) OLED DISPLAY PANEL, DRIVING METHOD AND DRIVING DEVICE THEREFOR

(71) Applicant: Wuhan China Star Optoelectronics Semiconductor Display Technology Co., Ltd., Wuhan, Hubei (CN)

(72) Inventor: Yong Yang, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/741,954

(22) PCT Filed: Dec. 18, 2017

(86) PCT No.: PCT/CN2017/116838
§ 371 (c)(1),
(2) Date: Oct. 19, 2018

(87) PCT Pub. No.: WO2019/019536
PCT Pub. Date: Jan. 31, 2019

(65) Prior Publication Data
US 2019/0043407 A1 Feb. 7, 2019

(30) Foreign Application Priority Data
Jul. 24, 2017 (CN) .......................... 2017 1 0608118

(51) Int. Cl.
*G09G 3/20* (2006.01)
*H01L 27/32* (2006.01)
(Continued)

(52) U.S. Cl.
CPC ......... *G09G 3/2003* (2013.01); *G09G 3/3208* (2013.01); *H01L 27/3216* (2013.01);
(Continued)

(58) Field of Classification Search
CPC ......... G09G 3/2003; G09G 2320/0693; G09G 2300/0452; G09G 2320/0666;
(Continued)

(56) References Cited

U.S. PATENT DOCUMENTS

2011/0291550 A1* 12/2011 Kim .................... G09G 3/2003
313/504
2018/0202616 A1* 7/2018 Yoon ........................ F21V 9/40
2019/0148676 A1* 5/2019 Morimoto ........... H01L 51/5044
257/40

FOREIGN PATENT DOCUMENTS

CN  1067282317 A  5/2017
CN  106935714 A   7/2017

* cited by examiner

*Primary Examiner* — Charles V Hicks
(74) *Attorney, Agent, or Firm* — Hemisphere Law, PLLC; Zhigang Ma

(57) ABSTRACT

An embodiment of the present invention discloses an OLED display panel, including a plurality of pixel structures arranged in an array, each pixel structure including a red sub-pixel, a green sub-pixel and blue sub-pixels, wherein the blue sub-pixel is a stacked device structure sequentially including a substrate layer, an anode layer, a first electroluminescent layer, a charge generating layer, a second electroluminescent layer and a cathode layer, wherein the first electroluminescent layer has a first blue light peak wavelength, the second electroluminescent layer has a second blue light peak wavelength, and the first blue light peak wavelength is greater than the second blue light peak wavelength. The invention also provides a corresponding driving method and driving device. By implementing the embodiments of the present invention, it is possible to reduce the content of the blue wavelength of the short wavelength in the display device.

5 Claims, 3 Drawing Sheets

(51) Int. Cl.
*H01L 51/50* (2006.01)
*G09G 3/3208* (2016.01)
*H01L 51/52* (2006.01)

(52) U.S. Cl.
CPC ........ *H01L 27/3218* (2013.01); *H01L 51/504* (2013.01); *H01L 51/5278* (2013.01); *G09G 2300/0426* (2013.01); *G09G 2300/0443* (2013.01); *G09G 2300/0452* (2013.01); *G09G 2320/0666* (2013.01); *G09G 2320/0693* (2013.01); *G09G 2360/16* (2013.01); *H01L 27/3244* (2013.01)

(58) Field of Classification Search
CPC ......... G09G 3/3208; G09G 2300/0426; G09G 2360/16; G09G 2300/0443; H01L 27/3218; H01L 51/504; H01L 27/3216; H01L 27/3244; H01L 51/5278
See application file for complete search history.

US 10,636,343 B2

OLED DISPLAY PANEL, DRIVING METHOD AND DRIVING DEVICE THEREFOR

RELATED APPLICATIONS

The present application is a National Phase of International Application Number PCT/CN2017/116838, filed Dec. 18, 2017, and claims the priority of China Application CN201710608118.6, filed Jul. 24, 2017.

FIELD OF THE DISCLOSURE

The disclosure relates to a display technical field, and more particularly to an OLED display panel and driving method and driving device therefor.

BACKGROUND

Organic Light Emitting Diode (OLED) has the characteristics of self-luminous, using a very thin organic material coating layer and glass substrate, when the current flow through, the organic material will emit light, and the viewing angle of the organic light emitting diode display panel is large, and can significantly save electricity, therefor the application of the organic light emitting diodes are now more and more widely;

With the increasingly popularization of portable terminal display devices such as mobile phones and tablet PCs, the time that people come into contact with such terminal displays products is getting longer and longer, and the blue light radiation received by human eyes is also more and more, resulting in more and more damage to human eyes. At present, the development of panel optical technology is moving toward reducing short-wave blue light, reducing the content of short-wave blue light in visible light, has the benefit of reducing the damage to human eyes by the blue light, however, the reduction of the content of the short-wave blue light will also affect the gamut of the overall panel, and the balance between the two needs to be found. Due to the fact that the light emitting wavelength of the OLED display device is determined by the bandgap of the light emitting material, the adjustment and the change cannot be performed. Currently, the low blue light technology has not yet been effectively applied in the OLED display technology.

SUMMARY

The technical problem to be solved by the present invention is to provide an OLED display panel, a corresponding driving method and a driving device by adopting a pixel structure of a stacked blue light emitting device, to realize a low blue light display of an OLED display device, and can maintain high gamut.

In order to solve the above technical problem, an aspect of an embodiment of the present invention provides an OLED display panel, includes a plurality of pixel structures arranged in an array, each pixel structure including a red sub-pixel, a green sub-pixel and blue sub-pixels, wherein the blue sub-pixel is a stacked device structure sequentially including a substrate layer, an anode layer, a first electroluminescent layer, a charge generating layer, a second electroluminescent layer and a cathode layer, wherein the first electroluminescent layer has a first blue light peak wavelength, the second electroluminescent layer has a second blue light peak wavelength, and the first blue light peak wavelength is greater than the second blue light peak wavelength.

Wherein the first blue light peak wavelength is 450-465 nm, the second blue light peak wavelength is 435-450 nm.

Wherein in each pixel structure, the green sub-pixel and the red sub-pixel are in the same column and are arranged in sequence one above the other, the blue sub-pixels are located in an adjacent column, and extends from a row where the green sub-pixel is located to a row where the red sub-pixel is located;

Or in each pixel structure, the red sub-pixel and the green sub-pixel are in the same column and are arranged in sequence one above the other, the blue sub-pixels are located in the adjacent columns, and extends from a row where the red sub-pixel is located to a row where the green sub-pixel is located.

Wherein the first electroluminescent layer includes a hole transport functional layer, a light emitting layer, an electron transport functional layer sequentially disposed in a direction away from the anode layer, the second electroluminescent layer includes a light emitting layer and an electron transporting functional layer sequentially disposed in a direction away from the charge generating layer, wherein the hole transporting functional layer is one or both of a hole injection layer and a hole transport layer, the electron transport functional layer is one or both of an electron injection layer and an electron transport layer.

Wherein the charge generating layer adopts a PN junction structure, and is one of an organic/organic structure, an organic/inorganic structure or an inorganic/inorganic structure.

Correspondingly, another aspect of the embodiments of the present invention further provides a driving method for an OLED display panel, including the steps of:

Determining whether a blue light saturation of an image frame to be displayed reaching a preset saturation threshold;

If yes, for blue sub-pixels corresponding to the image frame, only driving first electroluminescent layers to emit light; and If no, for blue sub-pixels corresponding to the image frame, simultaneously driving the first electroluminescent layers and second electroluminescent layers to emit light.

Wherein the step of for blue sub-pixels corresponding to the image frame, only driving first electroluminescent layers to emit light specifically includes:

For all of the blue sub-pixels in the image frame, performing a driving by a first current, the first current is in the range of 1 mA-5 mA.

Wherein the step of for blue sub-pixels corresponding to the image frame, simultaneously driving the first electroluminescent layers and second electroluminescent layers to emit light specifically includes:

For all of the blue sub-pixels in the image frame, performing the driving by a second current greater than the first current, the second current is in the range of 5 mA-10 mA.

Correspondingly, another aspect of the embodiments of the present invention further provides a driving device of an OLED display panel, including:

An image input unit configured to receive an image data of an image frame to be displayed;

An image analysis unit configured to calculate a blue light saturation of the image frame to be displayed, and the compared with a preset saturation threshold;

An image output unit including a driving circuit module for outputting a driving signal to a pixel structure in a display panel according to the image data of the image frame to be displayed, to drive and display a current frame;

Wherein, if the blue light saturation of the image frame to be displayed reaches the saturation threshold, the driving circuit module drives with a first current to the blue sub-pixels corresponding to the image frame, to make a first electroluminescent layer to emit light; and Wherein, if the blue light saturation of the image frame to be displayed is less than the saturation threshold, the driving circuit module drives with a second current larger than the first current to the blue sub-pixels corresponding to the image frame, to make the first electroluminescent layers and second electroluminescent layers to emit light.

Wherein the first current is in the range of 1 mA-5 mA, the second current is in the range of 5 mA-10 mA, the saturation threshold is in the range of 50% to 60%.

The implementation of the embodiments of the present invention has the following beneficial effects:

To sum up, the OLED display panel, the driving method and the driving method therefor provided by the embodiments of the present invention, for the blue sub-pixel is provided with the first electroluminescent layer and the second electroluminescent layer, the two electroluminescent layers have different blue light peak wavelengths. When the blue light saturation of the image frame to be displayed reaches the saturation threshold, performing to drive with a smaller current to make the first electroluminescent layer to realize emitting light normally, and the second electroluminescent layer cannot emit light normally due to the low hole injection rate, to realize the low blue light display. When the blue light saturation of the image frame to be displayed is less than the saturation threshold, is driven with a relatively large current to make the normal display of the first electroluminescent layer and the second electroluminescent layer, therefore ensure the gamut of the image and makes the image displayed closer to the true color.

BRIEF DESCRIPTION OF THE DRAWINGS

To describe the technical solutions in the embodiments of the present invention or in the conventional technology more clearly, the following briefly introduces the accompanying drawings required for describing the embodiments or the conventional technology. Apparently, the accompanying drawings in the following description merely show some embodiments of the present invention. For those skilled in the art, other drawings may be obtained based on these drawings without any creative work.

DETAILED DESCRIPTION OF PREFERRED EMBODIMENTS

Figure 1:
FIG. 1 is a schematic structural diagram of the OLED display panel according to one embodiment of the present invention.

The technical solutions in the embodiments of the present invention are clearly and completely described below with reference to the accompanying drawings in the embodiments of the present invention. Apparently, the described embodiments are merely some but not all embodiments of the present invention. All other embodiments obtained by a person of ordinary skill in the art based on the embodiments of the present invention without creative efforts shall fall within the protection scope of the present invention.

Here, it should also be noted that in order to avoid obscuring the present invention by unnecessary details, only the structures and/or processing steps that are closely related to the solutions according to the present invention are shown in the drawings, other details of the invention are of little relevance.

Figure 2:
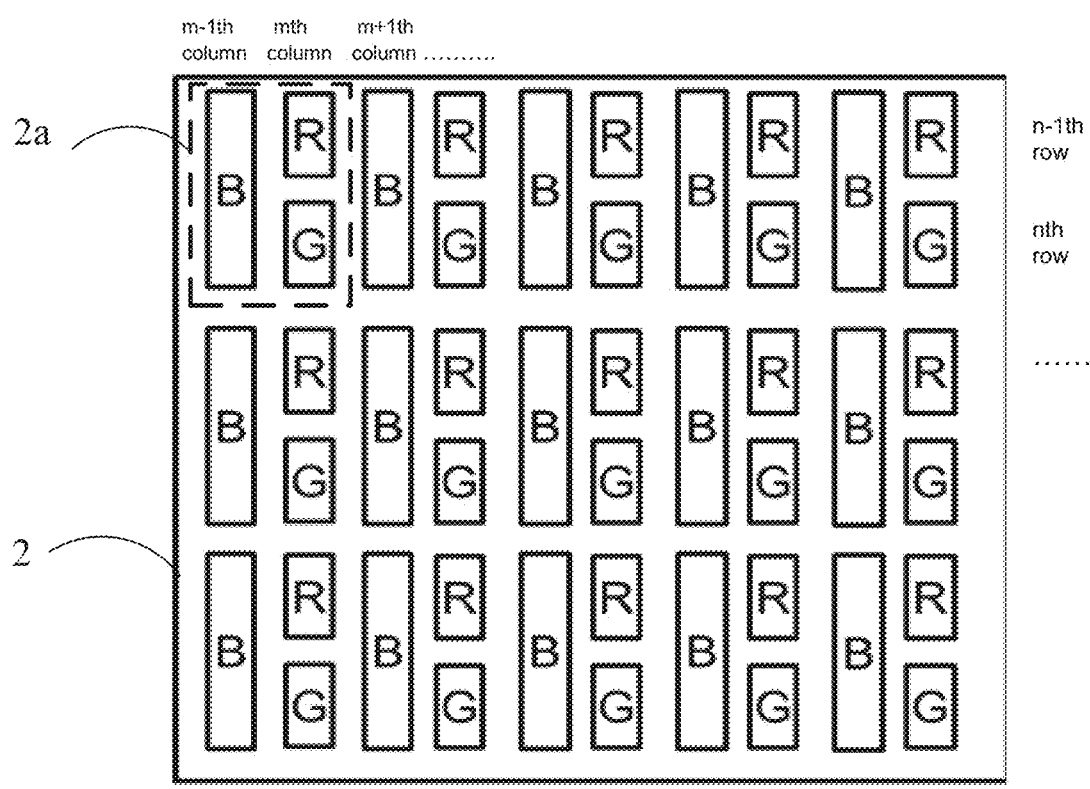
FIG. 2 is a schematic structural diagram of a pixel structure layer according to one embodiment in FIG. 1.
Figure 3:
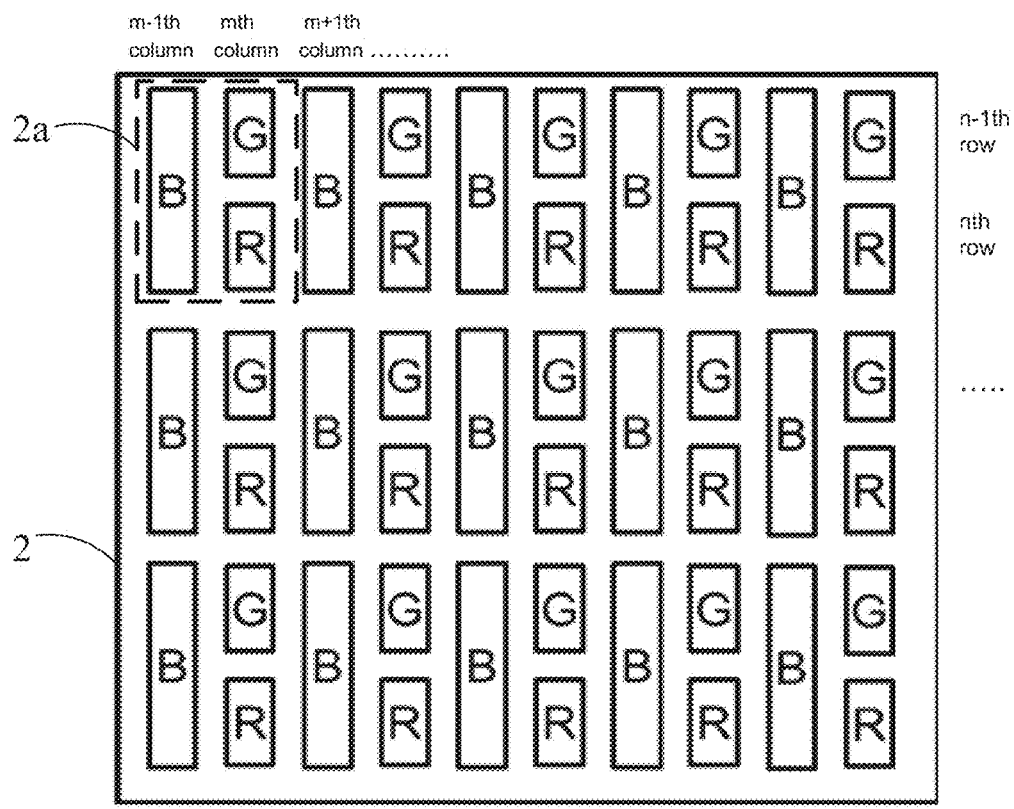
FIG. 3 is a schematic structural diagram of a pixel structure layer according to another embodiment of the present invention.
Figure 4:
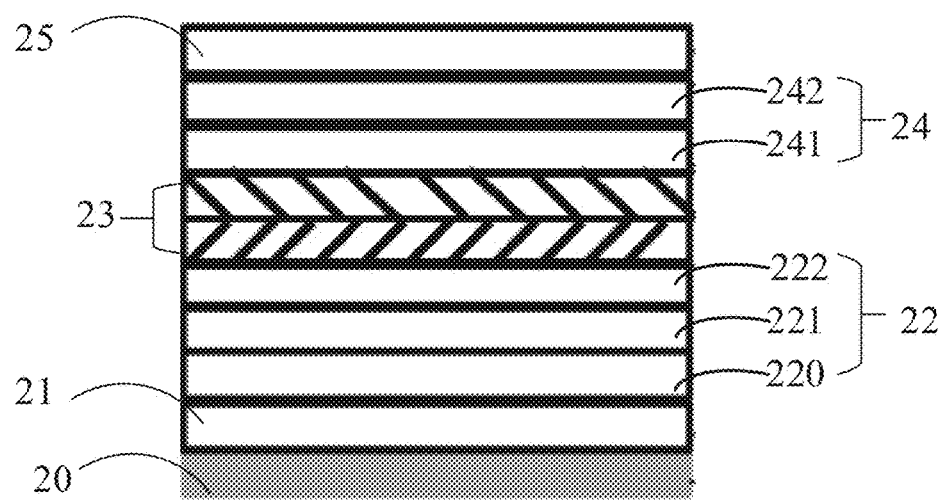
FIG. 4 is a schematic structural diagram of a sub-pixel according to one embodiment of the present invention.

As shown in FIG. 1 is a schematic structural diagram of the OLED display panel in one embodiment of the present invention, and combined referring to FIG. 2 to FIG. 4. In this embodiment, the OLED display panel includes a TFT array substrate 1 and a pixel structure layer 2 disposed on the TFT array substrate 1, an encapsulation layer 3 and a protection cover 4 are disposed on the pixel structure layer 2. The OLED display panel further includes a touch panel 5. The touch panel 5 is disposed between the encapsulation layer 3 and the protection cover 4. Wherein, as shown in FIG. 2, the pixel structure layer 2 includes a plurality of pixel structures 2a arranged in an array. Each pixel structure 2a includes a red sub-pixel R, a green sub-pixel G and blue sub-pixels B1, B2. It should be noted that, the pixel structures 2a of several rows and columns is only exemplarily shown in FIG. 2.

In this embodiment, in each pixel structure, the green sub-pixel and the red sub-pixel are in the same column and are arranged in sequence one above the other, the blue sub-pixel is located in the two adjacent columns, and extends from a row where the green sub-pixel is located to a row where the red sub-pixel is located; or in each pixel structure, the red sub-pixel and the green sub-pixel are in the same column and are arranged in sequence one above the other, the blue sub-pixel is located in the two adjacent columns, and extends from a row where the red sub-pixel is located to a row where the green sub-pixel is located.

Specifically, as shown in FIG. 2, the red sub-pixel R, the green sub-pixel G and the blue sub-pixel B in the pixel structure 2a adopt the following arrangement: in each pixel structure, the green sub-pixel is the sub-pixel located in the mth column and nth row, the red sub-pixel is the sub-pixel located in the mth column and n−1th row, the blue sub-pixel is the sub-pixel located in the m+1th column and extends from the n−1th row to the nth row. Taking the pixel structure 2a in the vicinity of the upper left corner in FIG. 2 as an example, the red sub-pixel R is a sub-pixel located in the second column and first row, the green sub-pixel G is a sub-pixel located in the second column and the second row, the blue sub-pixel B is a sub-pixel located in the first column and extending from the first row to the second row, wherein m and n are even numbers.

In another preferred embodiment, as shown in FIG. 3, the red sub-pixel R, the green sub-pixel G and the blue sub-pixel B in the pixel structure 2a adopt the following arrangement: the red sub-pixel R is a sub-pixel located in the mth column and nth row, the green sub-pixel G is a sub-pixel located in the mth column and the n−1th row, the blue sub-pixel B is a sub-pixel located in the m+1th column and extending from the n−1th row to the nth row.

Of course, in other embodiments, the arrangements of the red sub-pixel R, the green sub-pixel G and the blue sub-pixels B1, B2 may also be arranged in any manner as in the conventional technology.

In the embodiment of the present invention, in each pixel structure, the red sub-pixel R and the green sub-pixel G are the same as the device structure of the organic light emitting diode in the existing OLED. For example, in one example, each including an anode, a hole transporting functional layer, a light emitting layer, an electron transporting functional layer and a cathode stacked sequentially, wherein the hole transporting functional layer and the electron transporting functional layer are different according to the material of the light emitting layer, the luminescent color and the blue light peak wavelength of the light emitting layer are determined by selected light emitting material of the light emitting layer, for example, the light emitting layer of the red sub-pixel R is selected from a light emitting material that emits red light, and the light emitting layer of the green sub-pixel G is selected from a light emitting material that emits green light.

The general operation principle of the OLED display panel is that the holes generated in the anode layer 21 and the electrons generated in the cathode layer 25, under the action of the electric field, the holes are transported to the light emitting layer through the hole transport functional layer, and the electrons are transported to the light emitting layer through the electron transport functional layer, the holes and electrons are recombined and emitting light within the light emitting layer. Generally, the OLED display panel achieves different color display effects by a mixture of R, G, and B three primary colors, therefore, each pixel structure 2a generally includes three light emitting units of the red sub-pixel R, the green sub-pixel G and the blue sub-pixel B. Generally, the three light emitting units of each pixel unit can be individually controlled by a driving circuit, to realize individual driving of each light emitting unit. Specifically, the anode of each of the red sub-pixel R, the green sub-pixel G and the blue sub-pixel B is electrically connected to one thin film transistor of the TFT array substrate 1, each thin film transistor controls to drive each light-emitting unit individually.

In this embodiment, in each pixel structure, the blue sub-pixel B has a different structure from the red sub-pixel R and the green sub-pixel G. Specifically, as shown in FIG. 4, the blue sub-pixel B is a stacked device structure sequentially including a substrate layer 20, an anode layer 21, a first electroluminescent layer 22, a charge generating layer 23, a second electroluminescent layer 24 and a cathode layer 25, wherein the first electroluminescent layer 22 has a first blue light peak wavelength, the second electroluminescent layer 24 has a second blue light peak wavelength, and the first blue light peak wavelength is greater than the second blue light peak wavelength, and the bandgap of the luminescent material used in the first electroluminescent layer 22 is smaller than the bandgap of the luminescent material used in the second electroluminescent layer 24. In one example, the first blue light peak wavelength is 450-465 nm, the second blue light peak wavelength is 435-450 nm.

Specifically, the first electroluminescent layer 22 includes a hole transport functional layer 220, a light emitting layer 221, an electron transport functional layer 222 sequentially disposed in a direction away from the anode layer 21. The second electroluminescent layer 24 includes a light emitting layer 241 and an electron transporting functional layer 242 sequentially disposed in a direction away from the charge generating layer 23. Wherein the hole transporting functional layer 220 may be one or both of a hole injection layer and a hole transport layer, the electron transport functional layer 222, 242 may be one or both of an electron injection layer and an electron transport layer. Wherein, the hole injection layer and the hole transport layer have similar functions, and may be collectively referred to as a hole transport functional layer. The functions of the electron injection layer and the electron transport layer are similar, and may be collectively referred to as an electron transport functional layer.

More specifically, in some embodiments, in addition, the substrate layer 20 of the TFT array substrate 1 may be a rigid substrate, such as a glass substrate; or a flexible substrate, such as polyimide (PI) substrate; the anode layer 21 may adopt an ITO metal layer.

The charge generating layer 23 is a PN junction structure, in one embodiment, it may be an organic/organic structure, such as Alq3 (8-Hydroxyquinoline aluminum):Li/NPB(N, N'-Di[(1-naphthalenyl)-N,N'-diphenyl]-1,1'-biphenyl)-4,4'-dimine): $FeCl_3$, $Alq_3$:Mg/NPB: $WO_3$, Alq3: Mg/PTCDA(3, 4,9,10-Perylenetetracarboxylic Dianhydride):$MoO_3$ and the like; in some embodiment, it may also be an organic/inorganic structure, such as PEGDE (Diethylene glycol diglycidyl ether)/Al/$MoO_3$, $Alq_3$:$Cs_2CO_3$, $Alq_3$:Mg and the like; in other examples, it may also be an inorganic/inorganic structure such as LiF/Ca/Ag, LiF/Al/Au, LiF/$WO_3$/Au and the like.

The charge generating layer 23 functions to generate phase-separated electrons and holes under the driving voltage, and inject electrons into the first electroluminescent layer 22, inject holes into the second electroluminescent layer 24, the holes injected from the anode layer 21 and the electrons injected from the charge generating layer 23 are recombined and emitting light in the first electroluminescent layer 22; the electrons injected from the cathode layer 25 and the hole injected from the charge generating layer 23 are recombined and emitting light in the second electroluminescent layer 24.

In this embodiment, the first electroluminescent layer 22 has low blue light with a peak at 450 nm-465 nm, the second electroluminescent layer has normal blue light with a peak at 435 nm-450 nm. The principle of light emission is as follows: when the light emitting device is driven by current, the anode layer 21 injects holes into the first electroluminescent layer 22, the charge generating layer 23 injects electrons into the first electroluminescent layer 22, and injects holes into the second electroluminescent layer 24, the cathode layer 25 injects electrons into the second electroluminescent layer 24, so that the holes and the electrons recombine and emit light in the first electroluminescent layer 22 and the second electroluminescent layer 24. Due to the narrower bandgap of the low blue light material, the HOMO (Highest Occupied Molecular Orbital) energy level is shallower, and the first electroluminescent layer 22 has the hole transporting layer 220, the holes are easy to inject, and the smaller current driving can achieve normal emitting light; the bandgap of the common blue light material is wider, the HOMO level is deeper, and the second electroluminescent layer 24 is without hole transport functional layer, the hole is not easy to inject, requires a larger current driving to achieve normal emitting light.

The embodiment also provides the driving method and the driving device for the OLED display panel as described above.

Figure 5:
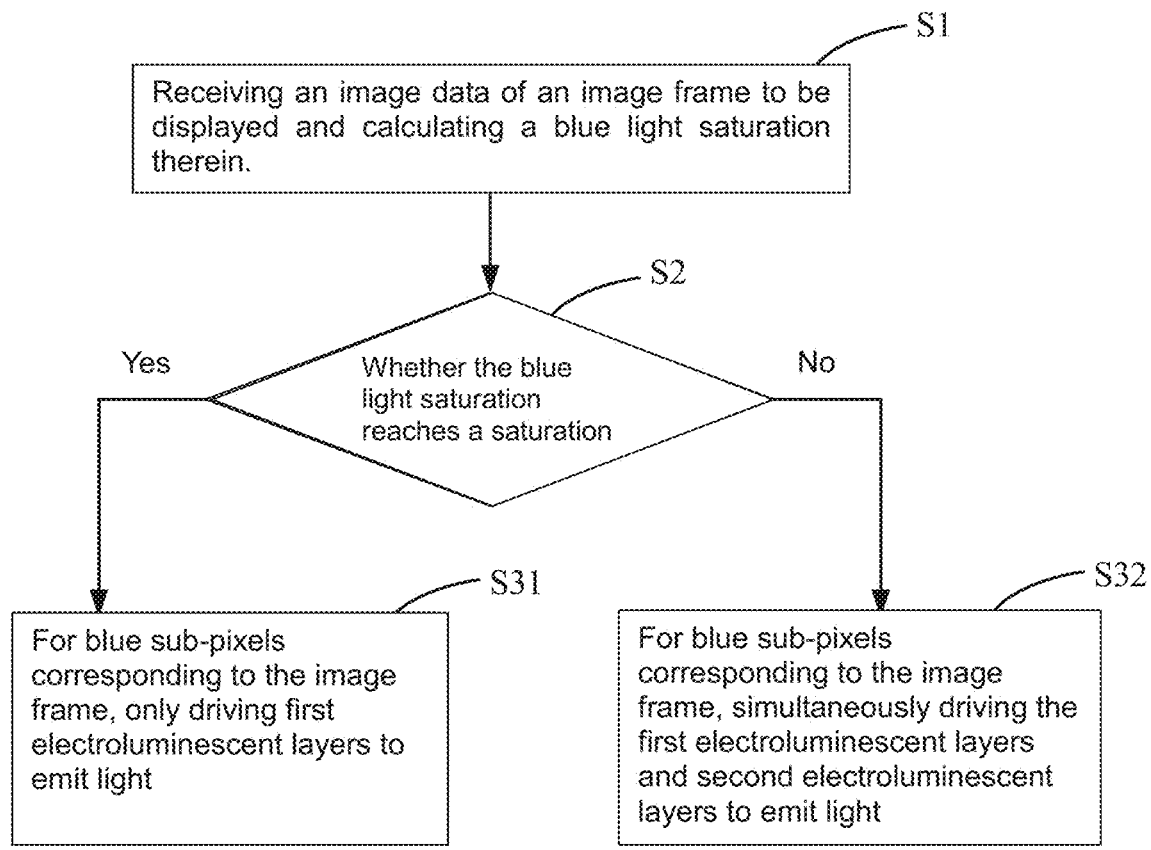
FIG. 5 is a main flow diagram of a method for driving an OLED display panel according to an embodiment of the present invention.

As shown in FIG. 5, the driving method for the OLED display panel in this embodiment includes:

Step S1, receiving an image data of the image frame to be displayed and calculating the blue light saturation therein.

Step S2, determining whether the blue light saturation of the image frame to be displayed reaches a saturation threshold.

Step S31, if yes, that is, the blue light saturation of the image frame to be displayed reaches the saturation threshold (equal to or greater than), only driving the first electroluminescent layer to emit light for display of the blue sub-pixel corresponding to the image frame. Specifically, for all of the blue sub-pixels in the image frame, performing a driving by a first current (a smaller current, such as 1 mA-5 mA). In this time, the first electroluminescent layer 22 can realize to emit light normally, and the second electroluminescent layer 24 cannot emit light normally due to the low hole injection rate, to realize the low blue light display.

Step S32, if no, that is, the blue light saturation of the image frame to be displayed is less than the saturation threshold, simultaneously driving the first electroluminescent layer and the second electroluminescent layer to emit light for display included by the blue sub-pixel corresponding to the image frame. Specifically, for all of the blue sub-pixels in the image frame, performing the driving by a second current greater than the first current (a relatively large current, such as 5 mA-10 mA), in this time, the first electroluminescent layer 22 can realize emitting light normally, the second electroluminescent layer 24 can also realize emitting light normally due to a larger current to drive, the gamut of the image is guaranteed, the display of the image is closer to the true color.

It should be noted that, in the above driving method, the red sub-pixel and the green sub-pixel do not need to be adjusted, and can be performed refer to the existing driving method.

Wherein, in the above driving method, the saturation threshold may be specifically set according to actual needs. Usually, the saturation value of 50% to 60% is usually set as the saturation threshold, and the most preferable value is 50%.

Figure 6:
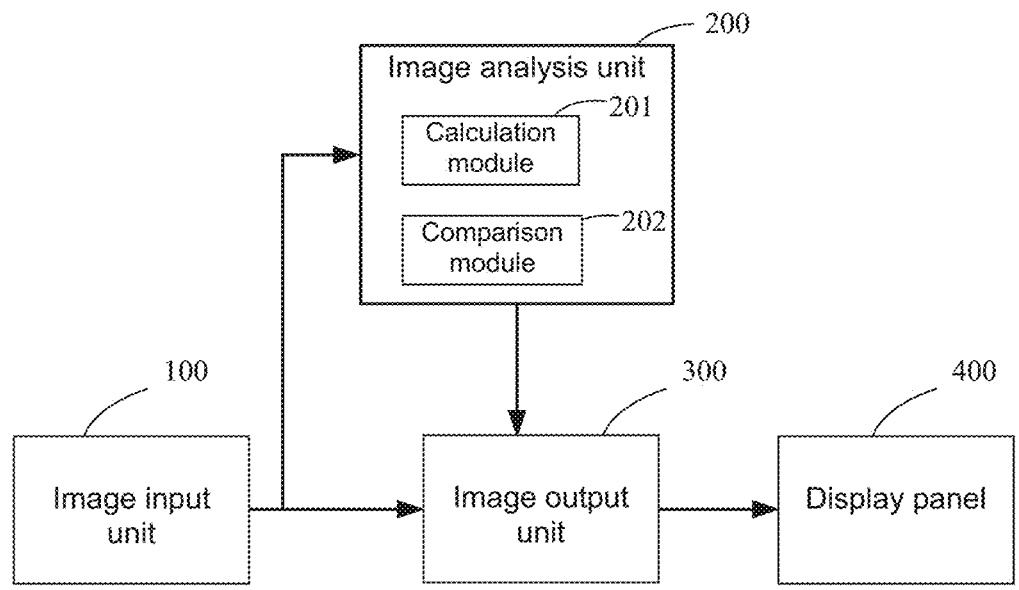
FIG. 6 is a schematic structural diagram of a driving device of an OLED display panel according to an embodiment of the present invention.

As shown in FIG. 6, the driving device of the OLED display panel in this embodiment includes an image input unit 100, an image analysis unit 200, and an image output unit 300.

Wherein, the image input unit 100 is configured to receive the image data of the image frame to be displayed, the received image data is sent to the image analysis unit 200 and the image output unit 300, respectively.

Wherein, the image analysis unit 200 includes a calculation module 201 and a comparison module 202. The calculation module 201 is configured to calculate the blue light saturation of the image frame to be displayed, the comparison module 202 is preset with the saturation threshold, the calculated blue light saturation is compared with a preset saturation threshold, and the comparison result is transmitted to the image output unit 300. The saturation threshold may be specifically set according to actual needs. Usually, the saturation value of 50% to 60% is usually set as the saturation threshold, and the most preferable value is 50%.

Wherein, the image output unit 300 includes a driving circuit module 301 for outputs a driving signal to the pixel structure in the display panel 400 according to the image data of the image frame to be displayed to drive and display the current frame.

Wherein, if the blue light saturation of the image frame to be displayed reaches the saturation threshold or more, the driving circuit module 301 drives with the first current to the blue sub-pixels corresponding to the image frame, to make the first electroluminescent layer to emit light; if the blue light saturation of the image frame to be displayed is less than the saturation threshold, the driving circuit module 301 drives with a second current larger than the first current to the blue sub-pixels corresponding to the image frame, to make the first electroluminescent layer and the second electroluminescent layer to emit light.

Wherein the first current is in the range of 1 mA-5 mA, the second current is in the range of 5 mA-10 mA, the saturation threshold is in the range of 50% to 60%.

To sum up, the OLED display panel, the driving method and the driving method therefor provided by the embodiments of the present invention, wherein for the blue sub-pixel is a stacked-device structure, and both sides of the charge generating layer are respectively provided with the first electroluminescent layer and the second electroluminescent layer, wherein the first electroluminescent layer has a first blue light peak wavelength, the second electroluminescent layer has a second blue light peak wavelength, the first blue light peak wavelength is greater than the second blue light peak wavelength, and the bandgap of the luminescent material used in the first electroluminescent layer is smaller than the bandgap of the luminescent material used in the second electroluminescent layer. When the blue light saturation of the image frame to be displayed reaches the saturation threshold, the first electroluminescent layer is driven normally with a smaller current to realize emitting light normally, and the second electroluminescent layer cannot emit light normally due to the low hole injection rate, to realize the low blue light display. When the blue light saturation of the image frame to be displayed is less than the saturation threshold, the first electroluminescent layer and the second electroluminescent layer are driven with a relatively large current, therefore to ensure the gamut of the image and makes the image displayed closer to the true color.

It should be noted that, in this document, relational terms such as first and second are merely used to distinguish one entity or operation from another entity or operation, without necessarily requiring or implying any actual relationship or order between such entities or operations. Moreover, the terms "include," "comprise," or any other variations thereof are intended to cover a non-exclusive inclusion such that a process, method, article, or apparatus that includes a list of elements includes not only those elements but also other elements that are inherent to such process, method, article, or device. Without further limitations, an element limited by the statement "including a . . . " does not exclude the existence of additional identical elements in the process, method, article, or apparatus that includes the element.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A driving method for an OLED display panel, comprising the steps of:
 determining whether a blue light saturation of an image frame to be displayed reaching a preset saturation threshold;
 if yes, for blue sub-pixels corresponding to the image frame, only driving first electroluminescent layers to emit light; and
 if no, for blue sub-pixels corresponding to the image frame, simultaneously driving the first electroluminescent layers and second electroluminescent layers to emit light.

2. The driving method for the OLED display panel according to claim 1, wherein the step of for blue sub-pixels corresponding to the image frame, only driving first electroluminescent layers to emit light specifically comprises:

for all of the blue sub-pixels in the image frame, performing a driving by a first current, the first current is in the range of 1 mA-5 mA.

3. The driving method for the OLED display panel according to claim 2, wherein the step of for blue sub-pixels corresponding to the image frame, simultaneously driving the first electroluminescent layers and second electroluminescent layers to emit light specifically comprises:

for all of the blue sub-pixels in the image frame, performing the driving by a second current greater than the first current, the second current is in the range of 5 mA-10 mA.

4. A driving device of an OLED display panel, comprising:

an image input unit configured to receive an image data of an image frame to be displayed;

an image analysis unit configured to calculate a blue light saturation of the image frame to be displayed, and the compared with a preset saturation threshold;

an image output unit comprising a driving circuit module for outputting a driving signal to a pixel structure in a display panel according to the image data of the image frame to be displayed, to drive and display a current frame;

wherein, if the blue light saturation of the image frame to be displayed reaches the saturation threshold, the driving circuit module drives with a first current to the blue sub-pixels corresponding to the image frame, to make a first electroluminescent layer to emit light; and wherein, if the blue light saturation of the image frame to be displayed is less than the saturation threshold, the driving circuit module drives with a second current larger than the first current to the blue sub-pixels corresponding to the image frame, to make the first electroluminescent layers and second electroluminescent layers to emit light.

5. The driving device of the LED display panel according to claim 4, wherein the first current is in the range of 1 mA-5 mA, the second current is in the range of 5 mA-10 mA, the saturation threshold is in the range of 50% to 60%.

* * * * *